US006433596B1

(12) United States Patent
Bossard

(10) Patent No.: US 6,433,596 B1
(45) Date of Patent: Aug. 13, 2002

(54) PROGRAMMABLE ON-CHIP DAMPING COEFFICIENT FOR CMOS FILTER CIRCUITS THAT GIVES FASTER LOCKUP TIMES AND LOWER JITTER IN PHASE LOCK LOOP CIRCUITS

(76) Inventor: Peter R. Bossard, 33 Oswin Turn, Langhorne, PA (US) 19047

( * ) Notice: Subject to any disclaimer, the term of this patent is extended or adjusted under 35 U.S.C. 154(b) by 0 days.

(21) Appl. No.: 09/346,521

(22) Filed: Jul. 2, 1999

(51) Int. Cl.⁷ .............................. H03L 1/02; H03L 7/06
(52) U.S. Cl. ......................... 327/157; 327/156; 331/17
(58) Field of Search ................................ 327/156, 157, 327/147, 148, 553, 558; 331/17, 14, 1 A

(56) References Cited

U.S. PATENT DOCUMENTS

| | | | |
|---|---|---|---|
| 5,666,083 A | * | 9/1997 | Meyers et al. ............... 327/553 |
| 5,677,648 A | * | 10/1997 | Jones ........................... 331/17 |
| 5,774,023 A | * | 6/1998 | Irwin ............................ 327/157 |
| 6,054,903 A | * | 4/2000 | Fiedler ......................... 331/17 |
| 6,226,339 B1 | * | 5/2001 | Nam et al. ................... 327/157 |

FOREIGN PATENT DOCUMENTS

JP       411103250 A   *   4/1999

* cited by examiner

*Primary Examiner*—Dinh T. Le
(74) *Attorney, Agent, or Firm*—LaMorte & Associates

(57) ABSTRACT

An improved loop filter device for use in a phase lock loop that improves lock-in time and cycle-to-cycle jitter in the phase lock loop. The loop filter is used in a phase lock loop circuit having a phase frequency detector, a charge pump, a voltage controlled oscillator and a divider. The loop filter has a first capacitor with a first side and a second side, wherein the first side of the first capacitor is coupled to the output of the charge pump and the input of the voltage controlled oscillator. A CMOS switch is coupled to the second side of the first capacitor, wherein the CMOS switch is selectively operable between an open condition and a closed condition. At least one second capacitor is coupled in parallel with said switch, wherein the first capacitor is joined in series with said at least one second capacitor when the CMOS switch is in its open condition.

12 Claims, 2 Drawing Sheets

PROGRAMMABLE ON-CHIP DAMPING COEFFICIENT FOR CMOS FILTER CIRCUITS THAT GIVES FASTER LOCKUP TIMES AND LOWER JITTER IN PHASE LOCK LOOP CIRCUITS

RELATED APPLICATIONS

This application is related in part to co-pending U.S. patent application Ser. No. 09/252,641, entitled, A Looped Circuit And Associated Method For Controlling The Relationship Between Current And Capacitance In CMOS And BICMOS Circuit Design, the disclosure of which is incorporated into this application by reference.

REFERENCE TO DOCUMENT DISCLOSURE

The matter in this application corresponds to the matter contained in Disclosure Document 446,511, filed Oct. 26, 1998, wherein this application assumes the priority date of that document.

BACKGROUND OF INVENTION

1) Field of the Invention

In general, the present invention relates to the design and manufacture of circuits containing phase lock loops. More particularly, the present invention relates to the circuit design of CMOS and BICMOS circuits that contain phase lock loops with on-chip loop filters.

2) Description of the Prior Art

In the prior art record, there are many phase lock loop circuits that are manufactured using CMOS and BICMOS manufacturing processes. The uses of CMOS and BICMOS manufacturing processes have many known advantages and disadvantages. Among the disadvantages is the inability to manufacture precision components with highly accurate absolute values. In many circuit designs, the circuit is engineered so that only the ratio of components needs to be accurate. In this manner, the importance of the accuracy of any one component is minimized. However, in design of the 'Loop Filter' in a phase lock loop, there is often a single resistor. It is highly desirable to manufacturer this resistor on-chip. By manufacturing the resistor on-chip, an external component is eliminated and the power can be reduced. The reduction in power results from the fact that currents can be lowered because the parasitic effects are much reduced with the resistor on-chip. However, if this resistor is manufactured using a CMOS or a BICMOS process, the variation in this resistor can be on the order of +/−50% or more over process and temperature. This is problematic because both the lock up time and the jitter of a phase lock loop are functions of the process and the temperature. This causes system performance to vary from manufactured lot to manufactured lot, and within each lot the system will vary as a function of temperature.

A common practice in CMOS and BICMOS processing is to laser trim the resistors used within a circuit to the values needed. This results in a precise resistor value within the circuit. Laser trimming is a time consuming and expensive process. In addition, the trimming process does not compensate for the change in resistor value that occurs when the temperature of the resistor changes. Changes in temperature can cause a CMOS resistor value to vary by +/−50%.

Most, if not all, of the existing techniques for incorporating an on-chip CMOS resistor into the loop filter of a phase lock loop, results in either process variation in the resistor or additional manufacturing using laser trimming. The temperature variation in the resistor is not addressed by laser trimming procedures. Therefore, even with laser trimmed circuits, the system performance of that circuit will vary widely with changes in temperature. This variation often forces the loop filter of a phase lock loop off the chip in order to meet design requirements. The off-chip design significantly increases the cost of the phase lock loop and the degree of power consumption.

A need therefore exists for a circuit design and associated method of manufacturing on-chip loop filters that are within exact performance parameters that remain stable across both process and temperature, thereby decreasing the lock-in time and improving the bit error rate in data recovery circuits used in many types of data storage and communication systems. This need is met by the present invention as described and claimed below.

SUMMARY OF THE INVENTION

An improved loop filter device for use in a phase lock loop that improves lock-in time and cycle-to-cycle jitter in the phase lock loop. The loop filter is used in a phase lock loop circuit having a phase frequency detector, a charge pump, a voltage controlled oscillator and a divider. The loop filter has a first capacitor with a first side and a second side, wherein the first side of the first capacitor is coupled to the output of the charge pump and the input of the voltage controlled oscillator. A CMOS switch is coupled to the second side of the first capacitor, wherein the CMOS switch is selectively operable between an open condition and a closed condition. At least one second capacitor is coupled in parallel with said switch, wherein the first capacitor is joined in series with said at least one second capacitor when the CMOS switch is in its open condition. The operation of the CMOS switch is controlled by the output of the phase frequency detector or some other dynamic loop parameter that is indicative of a phase of frequency error.

BRIEF DESCRIPTION OF THE DRAWINGS

For a better understanding of the present invention, reference is made to the following description of exemplary embodiments thereof, considered in conjunction with the accompanying drawings, in which.

DETAILED DESCRIPTION OF THE INVENTION

It is well know in the industry that the damping coefficient "$\zeta$" Zeta, in a second-order phase lock loop, has a dominant effect on the lock-up time and jitter of that phase lock loop.

Figure 1:
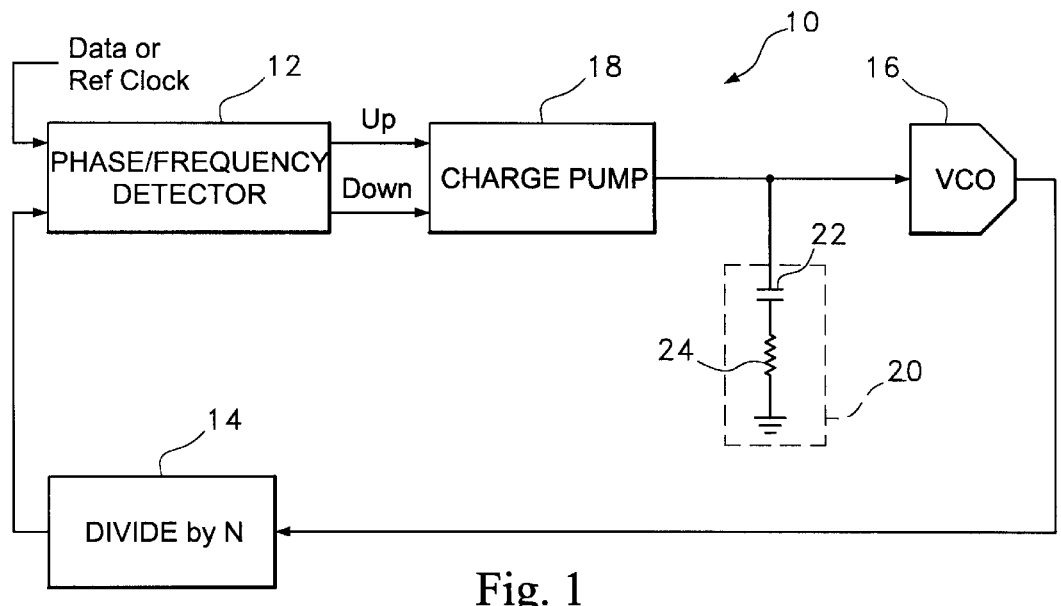
FIG. 1 is a schematic of a prior art second-order phase lock loop circuit.

Referring to FIG. 1, a typical prior art second-order phase lock loop circuit 10 is shown. The phase lock loop circuit 10 contains a phase frequency detector 12, wherein the phase frequency detector 12 has two inputs and two outputs. One of the inputs to phase frequency detector 12 is a reference clock or data signal. The other input of the phase frequency detector 12 is coupled to the output of a divider 14. The input to divider 14 is, in turn, connected to the output of a voltage controlled oscillator (VCO) 16.

The VCO 16 is connected to a charge pump 18. The VCO 16 is also connected to a loop filter 20. As is typical in prior art phase lock loop designs, the loop filter 20 contains a capacitor 22 joined in series with a resistor 24. One side of the capacitor 22 connects to the VCO 16 and the charge pump 18. The other side of the capacitor 22 is connected to the resistor 24, wherein the resistor 24 is coupled to ground.

In operation, the phase and frequency of the signals on the inputs to the phase frequency detector 12 determine how the charge pump 18 charges the capacitor 22. For the circuit in FIG. 1, it is well known that the damping coefficient (zeta) is given by:

$$Zeta_{R,C,Kv,N,I} = \frac{C*R}{2} * SQRT\left(\frac{Kv*I}{2\pi*N*C}\right)$$

Where Zeta, defined from FIG. 1, is a function of the elements in the above equation. The quantity Kv is the gain of the VCO 16. "I" is the output current of the charge pump 18, and N is the value at which the divider 14 is set to divide. It is well known in the industry that the above equation is not constant across process and temperature and therefore causes the phase lock loops to be very difficult to manufacture entirely in a CMOS process.

The present invention sets forth a circuit design and associated method of manufacturing loop filters used in phase lock loops that allows precise control of the damping coefficient (Zeta) in phase lock loops. As such, the present invention improves the lock-up time and decreases the jitter in phase lock loops. Furthermore, the damping coefficient (Zeta) canube programmed to a new value to improve the bit error rate without losing lock. Whatever value of the damping coefficient (Zeta) is programmed, it will be held constant independent of process and temperature. The act of programming a new value of the damping coefficient (Zeta) does not cause jitter in the phase lock loop, except as the phase lock loop is affected with a new value for the damping coefficient (Zeta).

Figure 2:
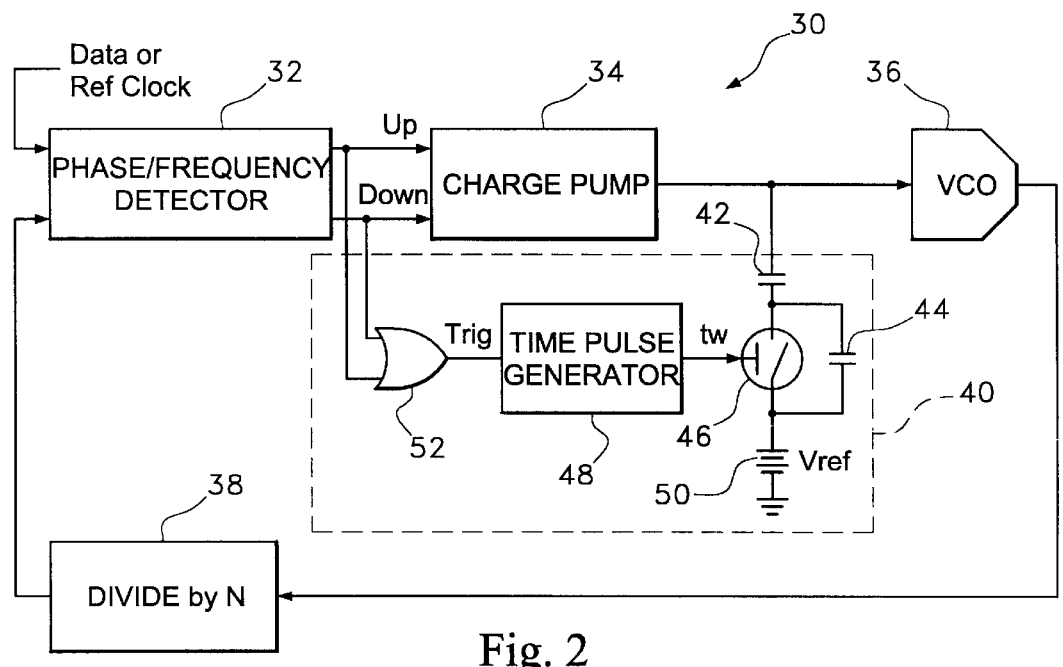
FIG. 2 is a schematic of a second-order phase lock loop in accordance with the present invention.

Referring to FIG. 2, a schematic of a second-order phase lock loop circuit 30 is shown in accordance with the present invention. The phase lock loop circuit 30 has a phase frequency detector 32, charge pump 34, VCO 36 and divider 38, as did the prior art phase lock loop of FIG. 1. The phase frequency detector 32 has an up output and a down output, both of which are coupled to the charge pump 34. The phase frequency detector 32 also has two inputs. One of the inputs to the phase frequency detector 32 is a timing clock or data signal. The other input of the phase frequency detector 32 is coupled to the output of the divider 38. The input to the divider 38 is connected to the output of the VCO 36. The input to the VCO 36 is, in turn, connected to a improved loop filter 40. The improved loop filter 40 contains a first capacitor 42, a second capacitor 44, a CMOS switch 46, a time pulse generator 48 and a reference voltage source 50.

The first capacitor 42 is coupled to the output of the charge pump 34 and the input of the VCO 36. The first capacitor 42 is connected to one side of the CMOS switch 46 and to one side of a second capacitor 44. The other side of the CMOS switch 46 is connected to the reference voltage source 50 and to the opposite side of the second capacitor 44. The reference voltage source 50 is connected to ground.

The gate of the CMOS switch 46 is connected to the time pulse generator 48. The time pulse generator 48 produces an output time pulse "tw". The input to the time pulse generator 48 is connected to the output of an OR gate 52. One of the inputs to the OR gate 52 is connected to the up output of the phase frequency detector 32 and to the up input of the charge pump 34. The other input to the OR gate 52 is connected to the down output of the phase frequency detector 32 and to the down input of the charge pump 34.

As has been previously mentioned, the phase frequency detector 32 has an up output and a down output. If either of these outputs is high, the "OR" gate 52 will be high. When the "OR" gate 52 goes high, it triggers the time pulse generator 48 and causes the time pulse generator 48 to output a timing pulse of width "tw". The timing pulse 'tw' will be described in detail later in this document. The output of the time pulse generator 48 is normally high. When the time pulse generator 48 outputs a timing pulse "tw", its output goes low for a time equal to "tw". When the output of the time pulse generator 48 is high, the CMOS switch 46 is in a low impedance state and the second capacitor 44 is effectively shorted out of the loop filter circuit 40. Both sides of the second capacitor 44 are connected to the reference voltage source 50 through a low impedance DC path. When either output of the phase frequency detector 32 goes high, the time pulse generator 48 will initiate the output of a low timing pulse "tw". When the output of the time pulse generator "tw" is low, the CMOS switch 46 is in a high impedance state. This puts the first capacitor 42 in series with the second capacitor 44. The effective capacitance between the output of the charge pump 34 and the reference voltage source 50 is the series combination of the first capacitor 42 and the second capacitor 44.

The output of the time pulse generator 48 goes low just before the charge pump 34 starts to output current to the series combination of the first capacitor 42 and the second capacitor 44. The second capacitor 44 is typically on the order of $\frac{1}{15}$ the size of the first capacitor 42, however other sized capacitors can also be used. When the charge pump 34 is supplying current, and the CMOS switch 46 is in a high impedance state, the voltage on the first capacitor 42 is increasing much more rapidly than when the CMOS switch 46 is in a low impedance state. The time period "tw" for which the CMOS switch 46 is in a high impedance state is given by:

$$tw = \left(t - \frac{tp}{2}\right)$$

Where t is a fixed time and 'tp' is the time that the output of the "OR" gate 52 is high. The fixed time "t" should be less than the maximum period of either of the signals that are connected to the input of the phase frequency detector 32. The value of the second capacitor 44 is then determined by:

$$C=t/R$$

As the second capacitor 44 is made larger, the dynamic range required by the charge pump 34 is reduced. The damping coefficient (Zeta) in this invention is given by:

$$Z_{tw,C2,C3,Kv,N,I} = \frac{C1}{C2} * \frac{tw}{2} * \text{sqrt}\left(\frac{Kv}{2\pi N * C1}\right)$$

The coefficient before the square root in the last equation no longer depends on resistance (R) and the error in the first capacitor 42 has been transformed into the error in the ratio of the first capacitor 42 divided by the second capacitor 44. The ratio of similar capacitors can be held to very tight tolerances. When the phase lock loop 30 is in lock, the damping coefficient (Zeta) depends linearly on the fixed time "t", because "tp/2" is very small. This allows the damping coefficient (Zeta) to be adjusted linearly by changing the fixed time "t", as will be later described.

An alternate method of changing the damping coefficient (Zeta) is to replace the second capacitor 44 with parallel capacitors. A simple four bit parallel combination of capacitors can give a 16 to 1 range change in the damping coefficient (Zeta).

Figure 3:
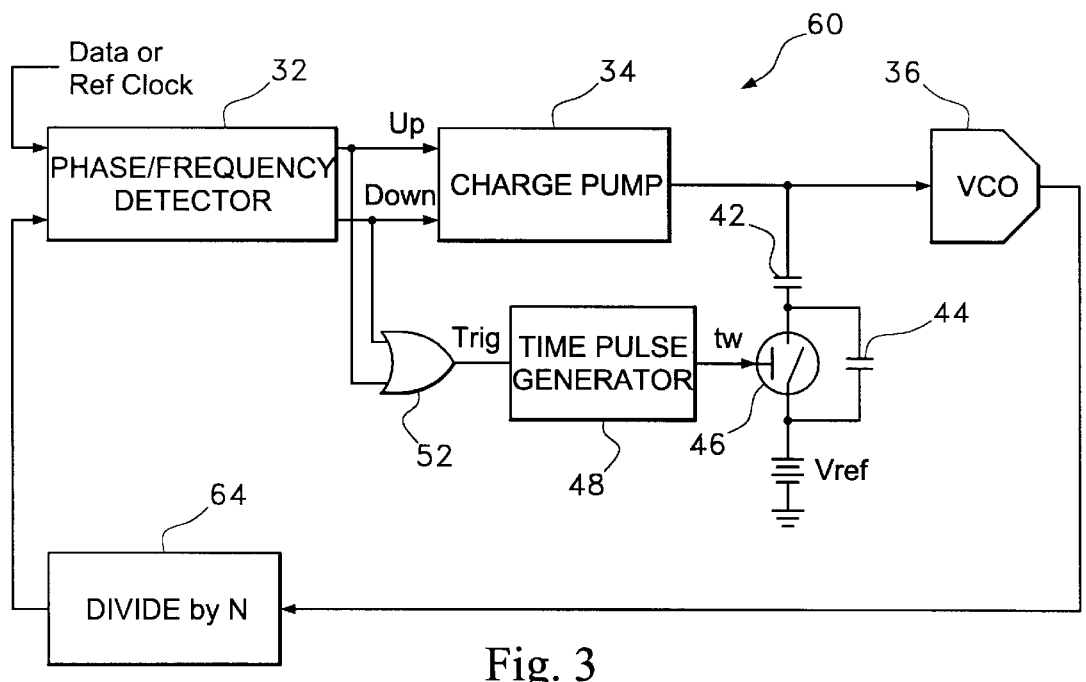
FIG. 3 is a schematic of an alternate embodiment of a second-order phase lock loop in accordance with the present invention.

Referring to FIG. 3, an alternate embodiment of a second-order phase lock loop circuit 60 is shown. The phase lock loop circuit 60 is identical to the circuit shown in FIG. 2, except a bias voltage (Vbias) is supplied to both the charge pump 34 and time pulse generator 48. Since the circuit embodiments of FIG. 2 and FIG. 3 share many similar components, the reference numbers that were used in describing the circuit of FIG. 2 will again be used to describe like components in the circuit of FIG. 3.

The bias voltage (Vbias) received by the charge pump 34 and the time pulse generator 48, is generated by an external circuit. The specifics of that external circuit are described and claimed in co-pending U.S. patent application Ser. No. 09/252,641, entitled, A Looped Circuit And Associated Method For Controlling The Relationship Between Current And Capacitance In CMOS and BiCMOS Circuit Design, which has already been incorporated into this specification by reference.

The value of the bias voltage (Vbias) is used to hold the ratio of the charge pump current to capacitance constant across process and temperature. In FIG. 3, the bias voltage (Vbias) is an input to the time pulse generator 48. The bias voltage (Vbias) is also an input to the charge pump 34 where it is used to bias the current mirrors that are a scaled version of the current mirrors used in the circuit that produces the bias voltage. Accordingly, by using common scaling techniques for CMOS transistors, current sources and capacitors, the damping coefficient (Zeta) depends only on the ratio of capacitors, a reference frequency, and a reference voltage.

Figure 4:
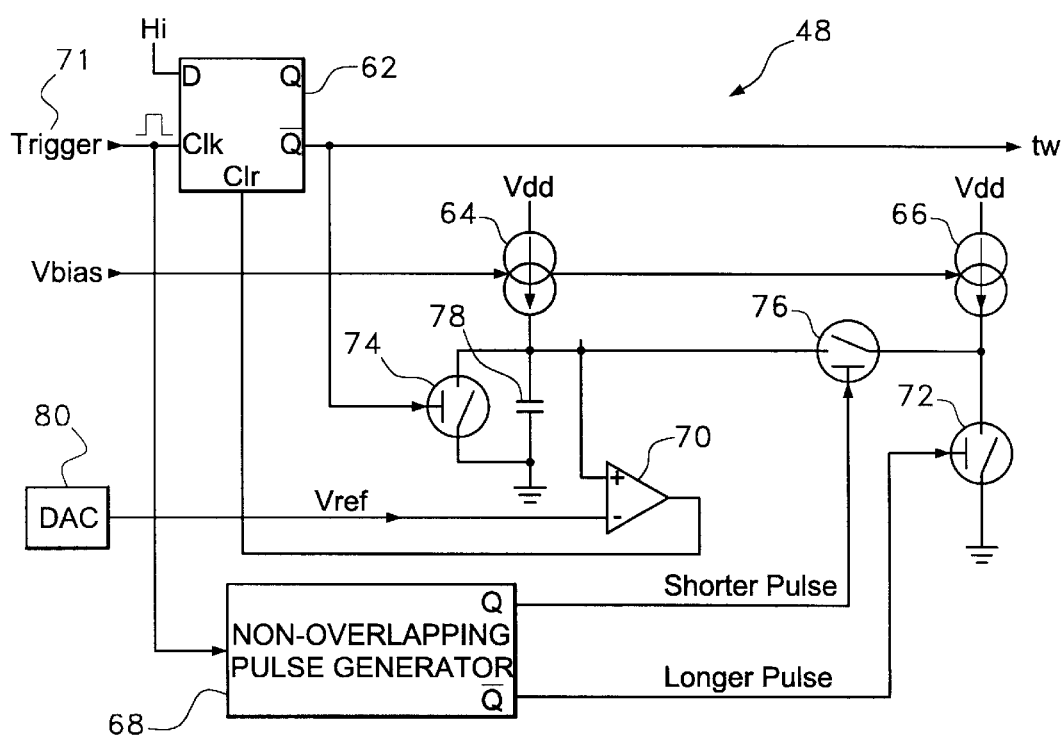
FIG. 4 is a schematic of a time pulse generator for use in a second-order phase lock loop.

In FIG. 3, the bias voltage (Vbias) is received by the time pulse generator 48. Referring now to FIG. 4, an embodiment of the time pulse generator 48 is shown. The time pulse generator 48 uses the bias voltage (Vbias) to generate precise time width pulses "tw" in typical CMOS processing, independent of process variations and temperature. The time pulse generator 48 includes a D-flip-flop 62, two current sources 64, 66, a non-overlapping pulse generator 68, a comparator 70 and three CMOS switches 72, 74, 76.

The D-flip-flop 62 has its "D" input connected to a high signal "HI". The D-flip-flop 62 also has its clock input "CLK" connected to a trigger signal 71 and to the input of the non-overlapping pulse generator 68. The non-overlapping pulse generator 68 generates a Q output. The Q output is connected to the gate of a first CMOS switch 72.

The positive clear input "CLR" of the D-flop-flop 62 is connected to the output of the comparator 70. The Q bar output "~Q" of the D-flop-flop 62 is connected to the gate of a second CMOS switch 74 and to the output pulse "tw". The bias voltage (Vbias) is connected to the control voltage of both the first current source 64 and the second current source 66. The first current source 64 has its source connected to VDD. The drain of the first current source 64 is connected to the drain of the second CMOS switch 74. The drain of the first current source 64 also leads to one side of a capacitor 78, the drain of the third CMOS switch 76 and to the positive input of the comparator 70.

The second current source 66 also has its source connected to VDD. The drain of the second current source 66 is connected to the drain of the first CMOS switch 72. The drain of the second current source 66 also is connected to one side of the third CMOS switch 76.

A programmable digital to analog converter 80 is also provided. The voltage output (Vref) of the programmable digital to analog converter 80 is connected to the negative input of the comparator 70. The Qbar output of the non-overlapping pulse generator 68 is connected to the gate of the first CMOS switch 72. The first CMOS switch 72 has its source connected to the drain of the second current source 66 and to one side of the third CMOS switch 76. The time pulse generator 48 generates a time pulse width that approximates "tw" as described above by the equation:

$$tw = \left(t - \frac{tp}{2}\right)$$

The time pulse "tw" is initiated from a rising edge on the trigger pulse 71 in FIG. 4, which causes the Qbar output of the D-flip-flop 62 to transition to the low state. This puts the second CMOS switch 74 into a high impedance state and allows the current from the first current source 64 to start charging the capacitor 78. This causes the voltage of the capacitor 78 to start ramping.

The trigger pulse 71 goes into the non-overlapping pulse generator 68. The rising edge of the trigger pulse 71 initiates the non-overlapping pulse generator 68, as is well known in the industry. The non-overlapping pulse generator 68 has two outputs. The shorter pulse of the non-overlapping pulse generator 68 is applied to the gate of the third CMOS switch 76. The longer pulse width is applied to the gate of the first CMOS switch 72. This causes the first CMOS switch 72 to go into a high impedance state slightly before the third CMOS switch 76 goes into a low impedance state. When the trigger pulse 71 drops back to a low state, the third CMOS switch 76 goes into a high impedance state slightly before the first CMOS switch 72 goes into a low impedance state. This process directs the current from the second current source 66, through the third CMOS switch 76, to the capacitor 78. The current from the second current source 66 adds charge to the capacitor 78 to reduce the fixed time "t" it takes to charge the capacitor 78 from ground to the reference voltage (Vref) by approximately tp/2.

As has been previously explained, the time "t" in the above equation is readily given by:

$$t = I * Vref/C1$$

Where C1 is a scaled version of the first capacitor 42 (FIG. 3) used in the phase lock loop, and the current "I" is generated from the first current source 64. The first current source 64 is a scaled version of the current source used to generate "I" in the external circuit that produces the bias voltage (Vbias).

The voltage on the capacitor 78 is initially at ground but it starts charging when the rising edge of a trigger pulse 71 is received. The capacitor 78 continues to charge until the voltage on capacitor 78 reaches the reference voltage (Vref). At this point, the output of the comparator goes high and clears the D-flip-flop, which forces "tw" high. The output of the programmable digital to analog converter 80 is the reference voltage, which supplies the voltage for the negative input to the comparator 70. The voltage from the programmable digital to analog converter 80 typically is generated from an on-chip band gap reference. The total current charging the capacitor 78 is in general the sum of two currents. The first current is from the first current source 64 and is used to generate the fixed time "t". The second current is from the second current source 66. The second current source 66 is designed to approximately reduce the pulse width "tw" by tp/2.

There are many techniques for reducing the width of a timing pulse. An approximation that is satisfactory is to scale the current from the second current source 66 so that it would charge the capacitor 78 to the reference voltage (Vref) in the nominal period of the input clock. This value of current for the second current source 66 is given by:

$$I = C * Vref/(\text{NOMINAL PERIOD})$$

If the fixed time "t" was chosen to be equal to the nominal period then the first and second current sources will be identical. The current from the second current source 66 is summed for the time that the input line trigger pulse 71 is high. The additional current summed in the capacitor 78 causes the time the output "tw" is low to be reduced by approximately tp/2.

The circuit in FIG. 4 can be simplified if desired by removing the second current source 66, the first CMOS switch 72, the second CMOS switch 74, and the non-overlapping pulse generator 68. This will result in a pulse width 'tw' that is equal to a fixed time t. This time as shown by a previous equation depends on the first current source 64, the programmable digital to analog converter output and the capacitor 78. The damping coefficient (Zeta) can be easily programmed, by programming either the first current source 64 or the reference voltage. This reprogramming can be done while the phase lock loop is in lock, to minimize the bit error rate.

The capacitors and current sources may be replaced with programmable capacitors and current sources if greater flexibility is desired. The invention disclosed here is very flexible. There is great range of fixed and variable times that may be used to control the second CMOS switch 74. There are many ways to make the basic invention presented here programmable. There are many digital circuits that could be implemented to generate the timing pulse tw that would perform well. It will be understood that the specifics of the embodiments of the present invention described above illustrates only a few exemplary embodiments of the present invention. A person skilled in the art can therefore make numerous alterations and modifications to the shown embodiment utilizing functionally equivalent components and circuit layouts to those shown and described. All such modifications are intended to be included within the scope of the present invention as defined by the appended claims.

What is claimed is:

1. In phase lock loop circuit having a phase frequency detector, a charge pump and a voltage controlled oscillator, an improved loop filter device, comprising:
   a first capacitor having a first side and a second side, wherein said first side is coupled to both said charge pump and said voltage controlled oscillator;
   a switch coupled to said second side of said first capacitor, wherein said switch is selectively operable between an open condition and a closed condition;
   a time pulse generator coupled to said switch, wherein said time pulse generator generates a pulse of a predetermined time period and said switch changes from said open condition to said closed condition during said predetermined time period; and
   at least one second capacitor coupled in parallel with said switch, wherein said first capacitor is joined in series with said at least one second capacitor when said switch is in said open condition.

2. The device according to claim 1, further including a reference voltage source, wherein said second side of said first capacitor is directly coupled to said reference voltage source when said switch is in said closed condition.

3. The device according to claim 1, wherein said predetermined time period is a fixed time period.

4. The device according to claim 1, wherein said predetermined time period is a fixed time period minus a variable time period.

5. The device according to claim 1, wherein said variable time period is controlled by the phase frequency detector.

6. A phase lock loop circuit, comprising:
   a phase frequency detector having an output;
   a charge pump coupled to said output of said phase frequency detector;
   a voltage controlled oscillator coupled to said charge pump;
   a first capacitor having a first side and a second side, wherein said first side is coupled to both said charge pump and said voltage controlled oscillator;
   a switch coupled to said second side of said first capacitor, wherein said switch is selectively operable between an open condition and a closed condition;
   at least one second capacitor coupled in parallel with said switch, wherein said first capacitor is joined in series with said at least one second capacitor when said switch is in said open condition;
   a timing pulse generator coupled to said switch, wherein said switch is selectively controlled by said timing pulse generator; and
   a comparator coupled to said output of said phase frequency detector, wherein said comparator controls said time pulse generator.

7. The circuit according to claim 6, further including a reference voltage source, wherein said second side of said first capacitor is directly coupled to said reference voltage source when said switch is in said closed condition.

8. The circuit according to claim 6, wherein said time pulse generator generates a pulse of a predetermined time period and said switch changes from said open condition to said closed condition during said predetermined time period.

9. The circuit according to claim 8, wherein said predetermined time period is a fixed time period.

10. The circuit according to claim 8, wherein said predetermined time period is a fixed time period minus a variable time period.

11. The circuit according to claim 10, wherein said variable time period is controlled by said phase frequency detector.

12. In a phase lock loop having a phase frequency detector, a charge pump, and a voltage controlled oscillator, a method of producing a loop filter that improves the performance of the phase lock loop, comprising the steps of:
   providing a first capacitor;
   providing a second capacitor;
   providing a switch that selectively connects said first capacitor and said second capacitor in series;
   comparing output signals from said phase frequency detector and producing a trigger signal when predetermined comparator criteria are met;
   generating a time pulse signal when said predetermined comparator criteria are met; and
   selectively controlling said switch with said time pulse signal.

* * * * *